United States Patent
Mineyama

(10) Patent No.: US 8,610,506 B2
(45) Date of Patent: Dec. 17, 2013

(54) AMPLIFIER CIRCUIT

(75) Inventor: Akiko Mineyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 50 days.

(21) Appl. No.: 13/402,564

(22) Filed: Feb. 22, 2012

(65) Prior Publication Data

US 2012/0218041 A1    Aug. 30, 2012

(30) Foreign Application Priority Data

Feb. 24, 2011  (JP) ................. 2011-038502
Oct. 17, 2011  (JP) ................. 2011-228040

(51) Int. Cl.
   *H03F 3/191* (2006.01)
(52) U.S. Cl.
   USPC .......................................... 330/302; 330/188
(58) Field of Classification Search
   USPC .................. 330/188, 292, 294, 302
   See application file for complete search history.

(56) References Cited

U.S. PATENT DOCUMENTS

| | | | | |
|---|---|---|---|---|
| 3,681,711 A | * | 8/1972 | Hanby | 331/112 |
| 5,191,302 A | * | 3/1993 | Rossnick | 331/109 |
| 7,339,436 B2 | * | 3/2008 | Fu et al. | 330/294 |
| 7,355,479 B2 | * | 4/2008 | Van Der Heijden | 330/292 |
| 8,446,217 B2 | * | 5/2013 | Bagga | 330/104 |

FOREIGN PATENT DOCUMENTS

WO   WO 2008/114311 A1   9/2008

OTHER PUBLICATIONS

David Cassan, et al., "A 1-V Transformer-Feedback Low-Noise Amplifier for 5-GHz Wireless LAN in 0.18-μm CMOS", IEEE Journal of Solid-State Circuits, vol. 38, No. 3, pp. 427-435, Mar. 2003.

* cited by examiner

Primary Examiner — Steven J Mottola
(74) Attorney, Agent, or Firm — Fujitsu Patent Center

(57) ABSTRACT

An amplifier circuit includes: a first transformer in which a first inductor and a second inductor are magnetically coupled; a first field-effect transistor in which a gate is connected to a first input node via the first inductor, a drain is connected to a drain bias potential node via the second inductor, and a source is connected to a reference potential node; and a first output node connected to the drain of the first field-effect transistor.

6 Claims, 6 Drawing Sheets

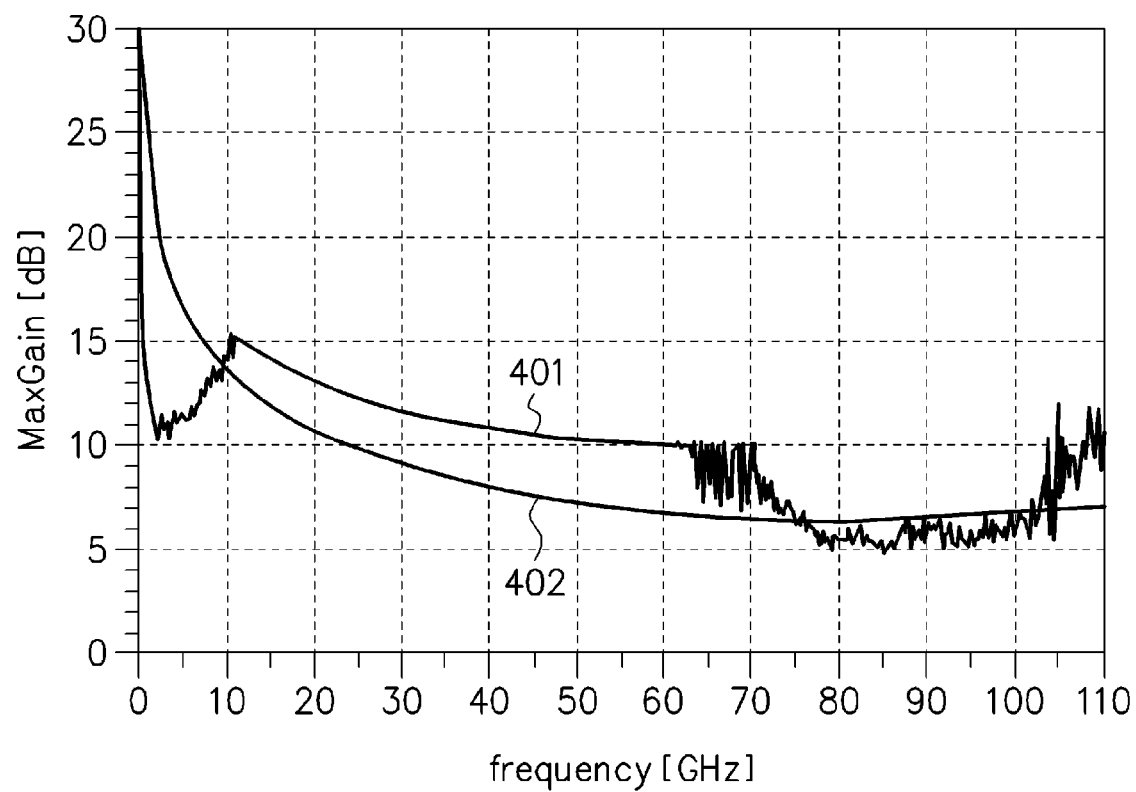
F I G. 4

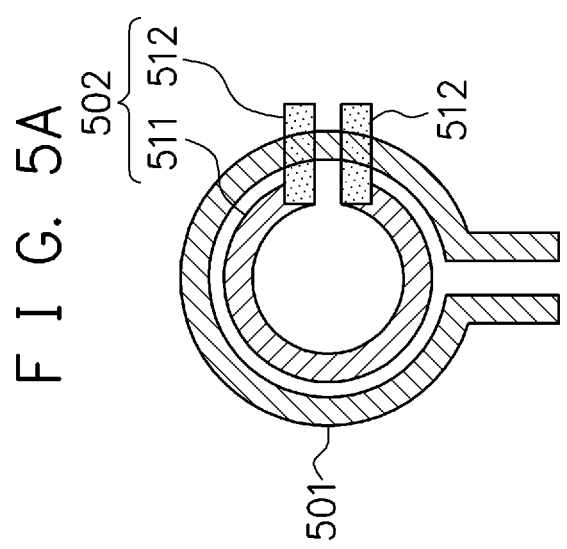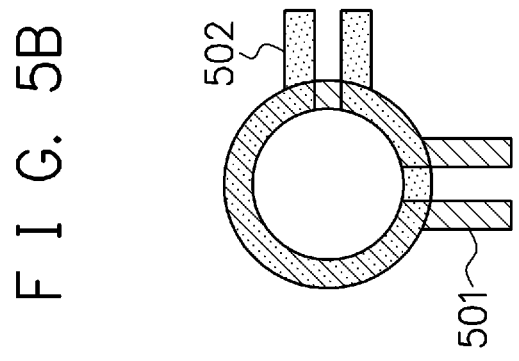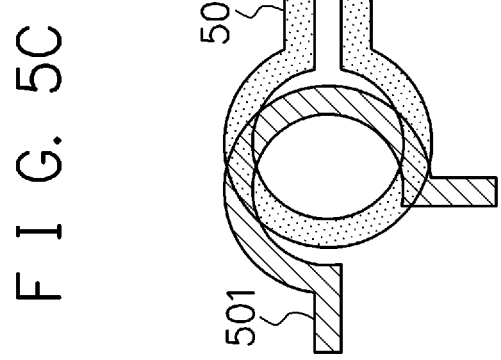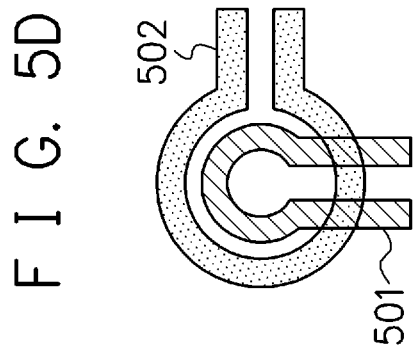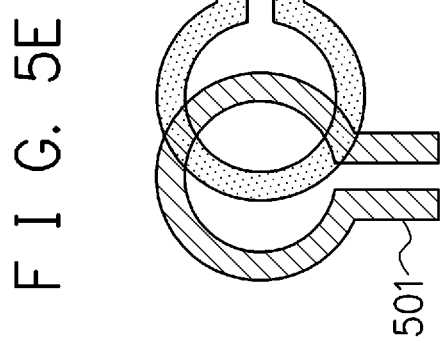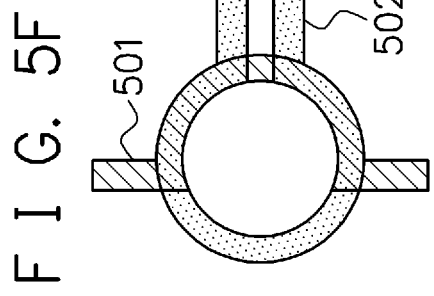

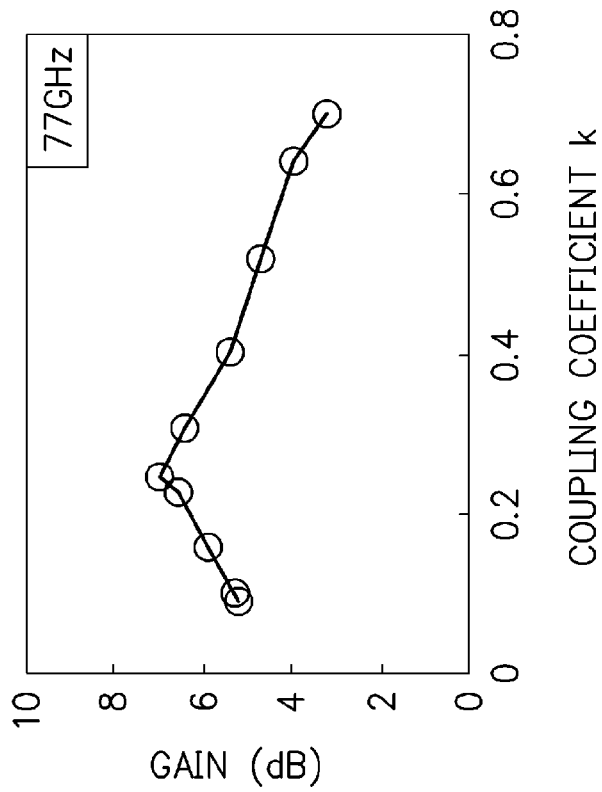
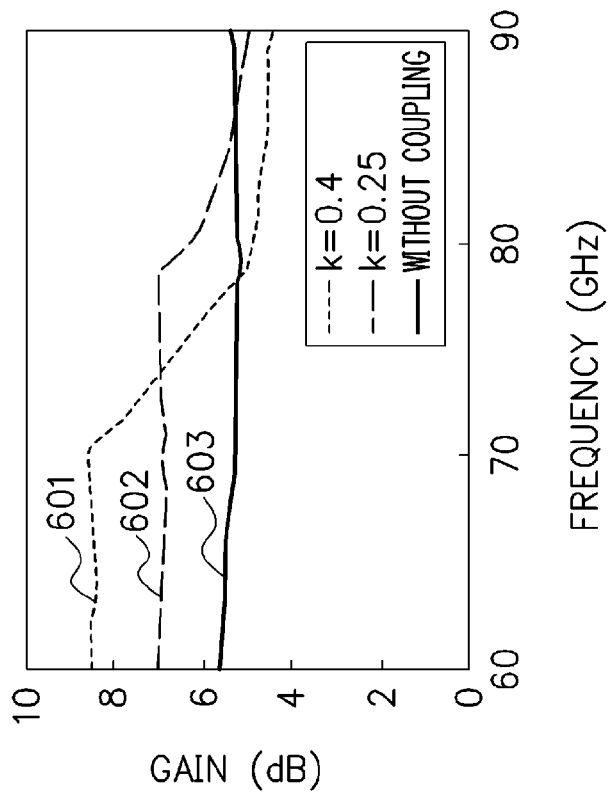
FIG. 6B
FIG. 6A

AMPLIFIER CIRCUIT

CROSS-REFERENCE TO RELATED APPLICATIONS

This application is based upon and claims the benefit of priority of the prior Japanese Patent Application No. 2011-038502, filed on Feb. 24, 2011, and the Japanese Patent Application No. 2011-228040, filed on Oct. 17, 2011, the entire contents of which are incorporated herein by reference.

FIELD

The embodiments discussed herein are directed to an amplifier circuit.

BACKGROUND

Amplifier circuits illustrated in FIG. 1 and FIG. 2 are known (for example, refer to the following Non-Patent Document 1). FIG. 1 is a circuit diagram illustrating a configuration example of a differential amplifier circuit. In an re-channel field-effect transistor 111, a gate is connected to a first differential input terminal INp, a source is connected to a reference potential node, and a drain is connected to a first differential output terminal OUTp. In an n-channel field-effect transistor 112, a gate is connected to a second differential input terminal INn, a source is connected to a reference potential node, and a drain is connected to a second differential output terminal OUTn. A capacitor 113 is connected between the gate of the n-channel field-effect transistor 112 and the drain of the n-channel field-effect transistor 111. A capacitor 114 is connected between the gate of the n-channel field-effect transistor 111 and the drain of the n-channel field-effect transistor 112. The differential amplifier circuit amplifies a differential signal input to the differential input terminals INp and INn, and outputs the amplified differential signal from the differential output terminals OUTp and OUTn. The re-channel field-effect transistors 111 and 112 each have a parasitic capacitance between the gate and the drain. The capacitors 113 and 114 are provided, and thereby, it is possible to cancel the parasitic capacitance between the gate and the drain of each of the n-channel field-effect transistors 111 and 112 and to enhance a gain of the differential amplifier circuit.

For example, the number of antennas of a radio communication device is normally one, and a single-phase signal (single-ended signal) is input from the antenna. Accordingly, when the differential amplifier circuit in FIG. 1 is used for the radio communication device, it is necessary to convert the single-phase signal into the differential signal, and to input the converted differential signal to the differential amplifier circuit in FIG. 1. However, there is a problem in which a loss of an input matching circuit becomes large for the extent that the single-phase signal is converted into the differential signal, and a noise figure becomes large caused by the loss. Accordingly, a single-phase amplifier circuit capable of amplifying not the differential signal but the single-phase signal as it is with high gain is desired in the radio communication device and so on.

FIG. 2 is a circuit diagram illustrating a configuration example of a single-phase amplifier circuit. In an n-channel field-effect transistor 211, a gate is connected to an input terminal IN, a drain is connected to an output terminal OUT, and a source is connected to a reference potential node. A series connection circuit of a capacitor 212 and an inductor 213 is connected between the gate and the drain of the n-channel field-effect transistor 211. The capacitor 212 has a function to cut a direct current between the gate and the drain of the n-channel field-effect transistor 211. The inductor 213 has a function to rotate a signal for 180 degrees, and it is possible to enhance the gain by compensating a parasitic capacitance between the gate and the drain of the n-channel field-effect transistor 211.

However, the inductor 213 has the function to rotate the signal for 180 degrees, and therefore, a very large inductance is required, a circuit area becomes considerably large, and it is difficult to actually use the inductor.

Besides, a low noise amplifier provided between a drain of a grounded-source transistor and a power supply voltage, and having a biasing inductor supplying a bias voltage to the drain of the grounded-source transistor is known (for example, refer to the following Patent Document 1).

[Patent Document 1] International Publication Pamphlet No. WO 2008/114311
[Non-Patent Document]
[Non-Patent Document 1] David J. Cassan, and John R. Long, "A 1-V Transformer-Feedback Low-Noise Amplifier for 5-GHz Wireless LAN in 0.18-μm CMOS" IEEE JOURNAL OF SOLID-STATE CIRCUITS, VOL. 38, NO. 3, pp. 427-435, MARCH 2003

SUMMARY

An amplifier circuit includes: a first transformer in which a first inductor and a second inductor are magnetically coupled; a first field-effect transistor in which a gate is connected to a first input node via the first inductor, a drain is connected to a drain bias potential node via the second inductor, and a source is connected to a reference potential node; and a first output node connected to the drain of the first field-effect transistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a graphic chart representing a simulation result of a frequency characteristic of a gain of the amplifier circuit in FIG. 3;

FIGS. 5A to 5F are views illustrating layout examples of a transformer in FIG. 3;

FIGS. 6A and 6B are graphic charts representing simulation results of the amplifier circuit in FIG. 3;

DESCRIPTION OF EMBODIMENTS

Figure 3:
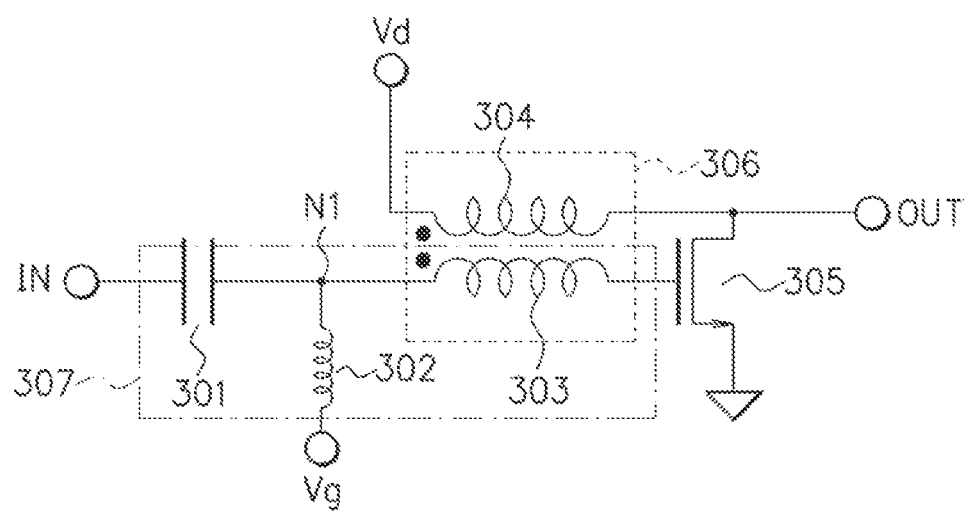
FIG. 3 is a circuit diagram illustrating a configuration example of an amplifier circuit according to an embodiment.

FIG. 3 is a circuit diagram illustrating a configuration example of an amplifier circuit according to an embodiment.

The amplifier circuit is a single-phase amplifier circuit having a capacitor 301, a third inductor 302, a transformer 306, an n-channel field-effect transistor 305, an input terminal IN, an input node N1, an output terminal OUT, a drain bias potential node Vd and a gate bias potential node Vg. The amplifier circuit amplifies a single-phase signal input to the input terminal IN with high gain, and outputs the amplified single-phase signal from the output terminal OUT. The amplifier circuit is a low noise amplifier circuit used for, for example, a radio communication device or a transceiver circuit of an on-vehicle radar and so on.

The capacitor 301 is connected between the input terminal IN and the input node N1. The third inductor 302 is connected between the input node N1 and the gate bias potential node Vg. The transformer 306 has a first inductor 303 and a second inductor 304 which are magnetically coupled with each other. In the n-channel field-effect transistor 305, a gate is connected to the input node N1 via the first inductor 303, a drain is connected to the drain bias potential node Vd via the second inductor 304, and a source is connected to a reference potential node (ground potential node). The drain bias potential node Vd supplies a drain bias potential to the drain of the n-channel field-effect transistor 305 via the second inductor 304. The gate bias potential node Vg supplies a gate bias potential to the gate of the n-channel field-effect transistor 305 via the third inductor 302 and the first inductor 303. The output terminal OUT is connected to the drain of the n-channel field-effect transistor 305. A single-phase signal at a high-frequency band is input to the input terminal IN. The amplifier circuit amplifies the single-phase signal input to the input terminal IN, and outputs the amplified single-phase signal from the output terminal OUT.

Figure 1:
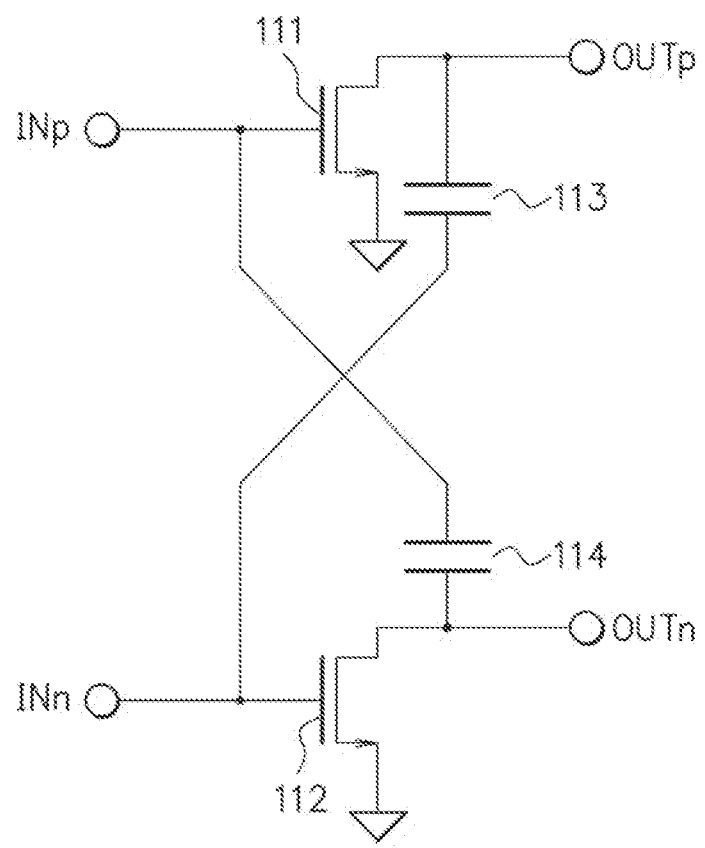
FIG. 1 is a circuit diagram illustrating a configuration example of a differential amplifier circuit.

A parasitic capacitance exists between the gate and the drain of the n-channel field-effect transistor 305. A signal current flows in the parasitic capacitance, then deterioration of gain of the amplifier circuit is incurred. In the present embodiment, an amount of current flowing in the parasitic capacitance between the gate and the drain of the n-channel field-effect transistor 305 is flowed back by the transformer 306, and thereby, a signal current flowing back to the parasitic capacitance between the gate and the drain of the re-channel field-effect transistor 305 is compensated. Namely, a potential of the input node N1 changes into plus side relative to a potential of the output terminal OUT, and the transformer 306 functions to let flow a current compensating the current which tries to flow from the gate to the drain of the re-channel field-effect transistor 305 via the parasitic capacitance. It is thereby possible to compensate the signal current flowing back to the parasitic capacitance between the gate and the drain of the n-channel field-effect transistor 305. On the other hand, the potential of the input node N1 changes into minus side relative to the potential of the output terminal OUT, and the transformer 306 functions to let flow a current compensating the current which tries to flow from the drain to the gate of the n-channel field-effect transistor 305 via the parasitic capacitance. It is thereby possible to compensate the signal current flowing back to the parasitic capacitance between the gate and the drain of the n-channel field-effect transistor 305. The signal current flowing back to the parasitic capacitance between the gate and the drain of the n-channel field-effect transistor 305 is compensated, and thereby, it is possible to improve the gain of the amplifier circuit. According to the present embodiment, the amplifier circuit is able to amplify the single-phase signal input to the input terminal IN with high gain, and to output the amplified single-phase signal from the output terminal OUT. Besides, in the present embodiment, it is not necessary to convert the single-phase signal into a differential signal as illustrated in FIG. 1, and therefore, a noise can be reduced because a loss in accordance with the conversion does not occur.

Figure 2:
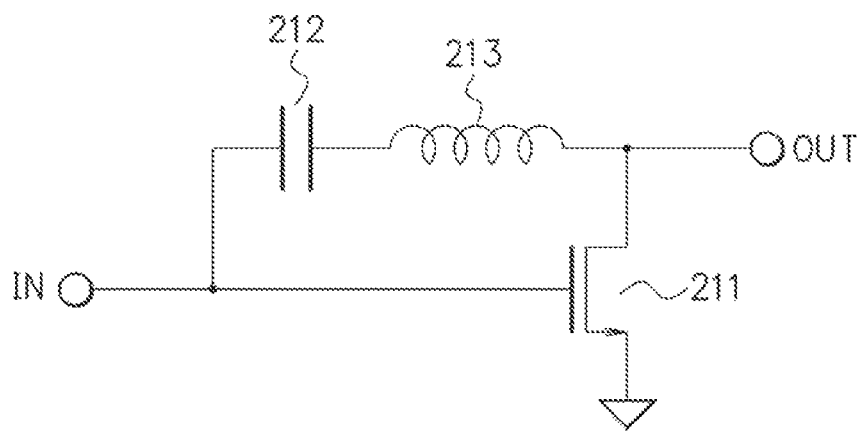
FIG. 2 is a circuit diagram illustrating a configuration example of a single-phase amplifier circuit.

Besides, an input matching circuit 307 has the capacitor 301, the first inductor 303, and the third inductor 302, and it is possible to prevent a reflection loss of a transmission path by matching an input impedance of the amplifier circuit and an output impedance of an external circuit of the input terminal IN. The transformer 306 has the first inductor 303 and the second inductor 304. Here, the first inductor 303 is used as a part of the input matching circuit 307, and the second inductor 304 is used as an inductor for supplying the drain bias potential, and therefore, it is possible to prevent an increase of the transformer 306 in size and to downsize the amplifier circuit. Besides, the first inductor 303 and the second inductor 304 are not necessary to have a function to rotate a signal for 180 degrees as against the inductor 213 in FIG. 2, and therefore, downsizing thereof is possible (refer to FIGS. 5A to 5F). Note that a configuration of the input matching circuit 307 having the first inductor 303 is not limited to the configuration in FIG. 3 and it may be the other configurations.

FIG. 4 is a graphic chart representing a simulation result of a frequency characteristic of a gain of the amplifier circuit in FIG. 3. A horizontal axis represents a frequency, and a vertical axis represents a maximum gain. A characteristic 401 represents a gain characteristic of the amplifier circuit in FIG. 3. A characteristic 402 represents a gain characteristic of the n-channel field-effect transistor (grounded-source transistor) 305 in FIG. 3 as a simple body, and represents the gain characteristic of the re-channel field-effect transistor 305 when the transformer 306 does not exist. The gain of the characteristic 401 becomes higher at a desired frequency band from 10 GHz to 70 GHz relative to the characteristic 402. The amplifier circuit of the present embodiment is able to improve the gain by providing the transformer 306. Note that the frequency characteristics in FIG. 4 are determined by a coupling coefficient and a turns ratio of the first inductor 303 and the second inductor 304 of the transformer 306. It is possible to improve the gain at the desired frequency band by settings of the coupling coefficient and the turns ratio.

FIGS. 5A to 5F are views illustrating layout examples of the transformer 306 in FIG. 3. The transformer 306 has the first inductor 303 and the second inductor 304. A first inductor 501 corresponds to one of the first inductor 303 and the second inductor 304, and a second inductor 502 corresponds to the other one of the first inductor 303 and the second inductor 304.

FIG. 5A is the view illustrating a first layout example of the transformer 306. The second inductor 502 has inductor portions 511 and 512 electrically connected with each other. The inductor portion 511 is provided at an identical wiring layer as the first inductor 501, and the inductor portion 512 is provided at a wiring layer different from the first inductor 501. In the first inductor 501 and the second inductor 502, center axes of windings are the same with each other, and winding numbers of the windings (approximately one) are the same with each other. However, in the first inductor 501 and the second inductor 502, radiuses of the windings are different from one another. The radius of the winding of the first inductor 501 is larger than the radius of the winding of the second inductor 502.

FIG. 5B is the view illustrating a second layout example of the transformer 306. The second inductor 502 is provided at a wiring layer different from the first inductor 501. In the first inductor 501 and the second inductor 502, the radiuses of the windings are the same with each other, the center axes of the windings are the same with each other, and the winding numbers of the windings (approximately one) are the same with each other. However, in the first inductor 501 and the second inductor 502, positions of terminals are deviated.

FIG. 5C is the view illustrating a third layout example of the transformer 306. The second inductor 502 is provided at a wiring layer different from the first inductor 501. In the first inductor 501 and the second inductor 502, the radiuses the windings are the same with each other. However, in the first inductor 501 and the second inductor 502, the center axes of the windings are deviated from one another. The center axis of the winding of the first inductor 501 deviates to a left from the center axis of the winding of the second inductor 502. Besides, in the first inductor 501 and the second inductor 502, the winding numbers of the windings are different from one another. The winding number of the winding of the first inductor 501 is a three quarter, and the winding number of the winding of the second inductor 502 is approximately one.

FIG. 5D is the view illustrating a fourth layout example of the transformer 306. The second inductor 502 is provided at a wiring layer different from the first inductor 501. In the first inductor 501 and the second inductor 502, the center axes of the windings are the same with each other, and the winding numbers of the windings (approximately one) are the same with each other. However, in the first inductor 501 and the second inductor 502, the radiuses of the windings are different from one another. The radius of the winding of the first inductor 501 is smaller than the radius of the winding of the second inductor 502.

FIG. 5E is the view illustrating a fifth layout example of the transformer 306. The second inductor 502 is provided at a wiring layer different from the first inductor 501. In the first inductor 501 and the second inductor 502, the radiuses of the windings are the same with each other, and the winding numbers of the windings (approximately one) are the same with each other. However, in the first inductor 501 and the second inductor 502, the center axes of the windings are deviated from one another. The center axis of the winding of the first inductor 501 deviates to the left from the center axis of the winding of the second inductor 502.

FIG. 5F is the view illustrating a sixth layout example of the transformer 306. The second inductor 502 is provided at a wiring layer different from the first inductor 501. In the first inductor 501 and the second inductor 502, the radiuses of the windings are the same with each other, and the center axes of the windings are the same with each other. However, in the first inductor 501 and the second inductor 502, the winding numbers of the windings are different from one another. The winding number of the winding of the first inductor 501 is a half, and the winding number of the winding of the second inductor 502 is approximately one. Accordingly, the turns ratio of the first inductor 501 and the second inductor 502 is approximately one to two.

Note that the winding numbers of the windings of the first inductor 501 and the second inductor 502 may be larger than one. The turns ratio of the first inductor 501 and the second inductor 502 is determined by the radiuses of the windings, a deviation amount of the center axes of the windings, and the winding numbers of the windings of the first inductor 501 and the second inductor 502. All of the radiuses of the windings, the positions of the center axes of the windings, and the winding numbers of the windings of the first inductor 501 and the second inductor 502 may be made to be the same or to be different from one another, or a part thereof may be made different. The radiuses of the windings, the deviation amount of the center axes of the windings, and the winding numbers of the windings of the first inductor 501 and the second inductor 502 are set, and thereby, it is possible to improve the gain at the desired frequency band in FIG. 4.

As stated above, according to the present embodiment, it is possible to compensate the signal current flowing back to the parasitic capacitance between the gate and the drain of the field-effect transistor 305 by providing the transformer 306, and therefore, it is possible to amplify the single-phase signal with high gain. Besides, the first inductor 303 can be used as a part of the input matching circuit 307, and the second inductor 304 can be used as the inductor for supplying the drain bias potential. Accordingly, it is possible to prevent the increase of the transformer 306 in size, and to downsize the amplifier circuit.

FIG. 6A is a graphic chart representing a simulation result of the frequency characteristic of the gain when a coupling coefficient "k" of the transformer 306 of the amplifier circuit in FIG. 3 is changed. A characteristic 601 represents a frequency characteristic when the coupling coefficient "k" of the first inductor 303 and the second inductor 304 of the transformer 306 is 0.4. A characteristic 602 represents a frequency characteristic when the coupling coefficient "k" of the first inductor 303 and the second inductor 304 of the transformer 306 is 0.25. A characteristic 603 represents a frequency characteristic when the magnetic coupling between the first inductor 303 and the second inductor 304 does not exist. The gain becomes large as the coupling coefficient "k" becomes large when the frequency is approximately 70 GHz or less. However, the frequency band capable of obtaining high gain becomes narrow as the coupling coefficient "k" becomes large, and the high gain can be obtained only at a low frequency.

FIG. 6B is a graphic chart representing a simulation result of the gain relative to the coupling coefficient "k" at a frequency of 77 GHz in FIG. 6A. It is possible to obtain a peak of the maximum gain when the coupling coefficient "k" is at approximately 0.25. The gain becomes large as the coupling coefficient "k" becomes large at a range in which the coupling coefficient "k" is smaller than approximately 0.25. On the other hand, the gain becomes small as the coupling coefficient "k" becomes large at a range when the coupling coefficient "k" is larger than approximately 0.25. The coupling coefficient "k" capable of obtaining the maximum gain may be selected in accordance with the used frequency.

Figure 7A:
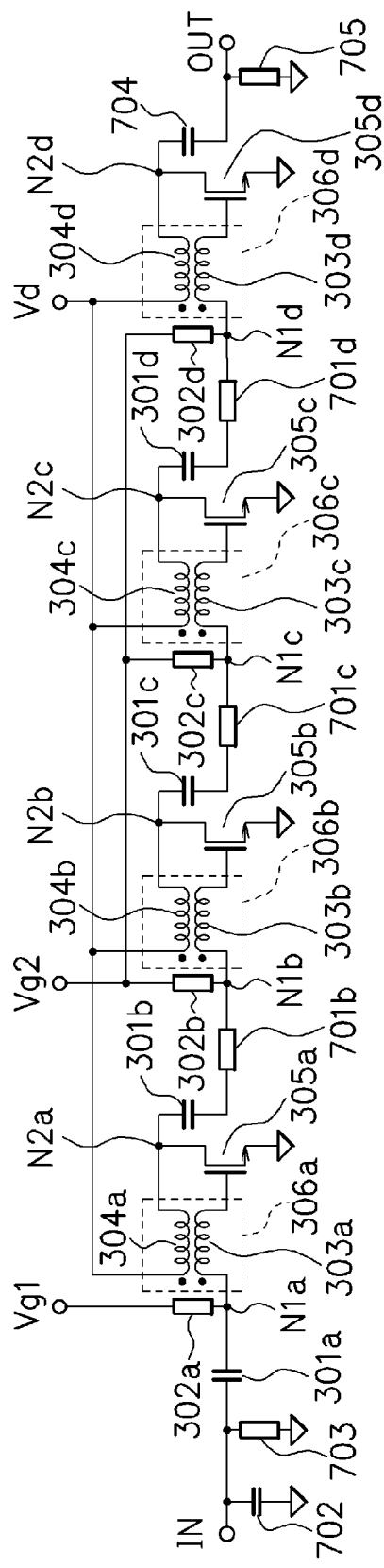
FIG. 7A is a circuit diagram illustrating a configuration example of an amplifier circuit according to another embodiment.

FIG. 7A is a circuit diagram illustrating a configuration example of an amplifier circuit according to another embodiment. The amplifier circuit in FIG. 7A is an amplifier circuit in which one-stage amplifier circuits in FIG. 3 are connected in four stages in series, and it amplifies a signal of an input terminal IN, and outputs the amplified signal from an output terminal OUT. Inductors 302a, 302b, 302c, 302d, 701b, 701c, 701d, 703, and 705 are, for example, inductance components of a transmission line.

A capacitor 702 is connected between the input terminal IN and a reference potential node (ground potential node). The inductor 703 is connected between the input terminal IN and a reference potential node. A first capacitor 301a is connected between a first input node N1a and the input terminal IN. The third inductor 302a is connected between the first input node N1a and a first gate bias potential node Vg1. The capacitors 301a, 702, and the inductors 302a, 703 are an input matching circuit. A first transformer 306a has a first inductor 303a and a second inductor 304a which are magnetically coupled with each other. In a first field-effect transistor 305a, a gate is connected to the first input node N1a via the first inductor 303a, a drain is connected to a drain bias potential node Vd via the second inductor 304a, and a source is connected to a reference potential node. A first output node N2a is connected to the drain of the first field-effect transistor 305a.

A series connection circuit of a second capacitor 301b and the seventh inductor 701b is connected between the first output node N2a and a second input node N1b. Note that the seventh inductor 701b may not be provided. The sixth inductor 302b is connected between the second input node N1b and a second gate bias potential node Vg2.

A second transformer 306b has a fourth inductor 303b and a fifth inductor 304b which are magnetically coupled with each other. In a second field-effect transistor 305b, a gate is connected to the second input node N1b via a fourth inductor 303b, a drain is connected to the drain bias potential node Vd via the fifth inductor 304b, and a source is connected to a reference potential node. A second output node N2b is connected to the drain of the second field-effect transistor 305b.

A series connection circuit of a third capacitor 301c and the eleventh inductor 701c is connected between the second output node N2b and a third input node N1c. Note that the eleventh inductor 701c may not be provided. The tenth inductor 302c is connected between the third input node N1c and the second gate bias potential node Vg2. A third transformer 306c has an eighth inductor 303c and a ninth inductor 304c which are magnetically coupled with each other. In a third field-effect transistor 305c, a gate is connected to the third input node N1c via the eighth inductor 303c, a drain is connected to the drain bias potential node Vd via the ninth inductor 304c, and a source is connected to a reference potential node. A third output node N2c is connected to the drain of the third field-effect transistor 305c.

A series connection circuit of a fourth capacitor 301d and the fifteenth inductor 701d is connected between the third output node N2c and a fourth input node N1d. Note that the fifteenth inductor 701d may not be provided. The fourteenth inductor 302d is connected between the fourth input node N1d and the second gate bias potential node Vg2. A fourth transformer 306d has a twelfth inductor 303d and a thirteenth inductor 304d which are magnetically coupled with each other. In a fourth field-effect transistor 305d, a gate is connected to the fourth input node N1d via the twelfth inductor 303d, a drain is connected to the drain bias potential node Vd via the thirteenth inductor 304d, and a source is connected to a reference potential node. A fourth output node N2d is connected to the drain of the fourth field-effect transistor 305d.

A capacitor 704 is connected between the fourth output node N2d and the output terminal OUT. The inductor 705 is connected between the output terminal OUT and a reference potential node. The capacitor 704 and the inductor 705 are an output matching circuit.

Figure 7B:
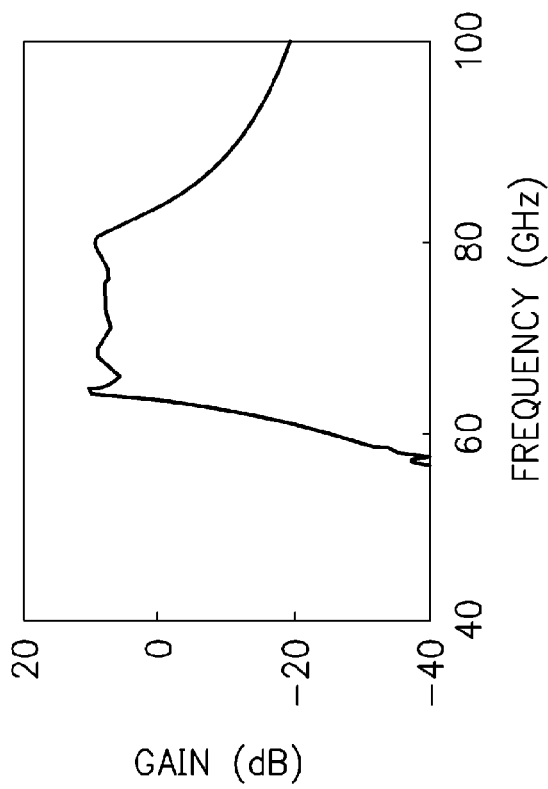
FIG. 7B is a graphic chart illustrating a measurement result of a frequency characteristic of a gain of a production prototype of the amplifier circuit in FIG. 7A.

FIG. 7B is a graphic chart representing a measurement result of a frequency characteristic of a gain of a production prototype of the amplifier circuit in FIG. 7A. The production prototype of the amplifier circuit is measured, and thereby, it is verified that the amplifier circuit operates normally. Besides, it is verified that a high gain can be obtained at a frequency of approximately 60 GHz to 80 GHz.

Incidentally, the above-described embodiments are to be considered in all respects as illustrative and no restrictive. Namely, the present invention may be embodied in other specific forms without departing from the spirit or essential characteristics thereof.

It is possible to compensate a signal current flowing back to a parasitic capacitance between a gate and a drain of a first field-effect transistor by providing a first transformer, and therefore, it is possible to amplify a single-phase signal with high gain. Besides, a first inductor can be used as a part of an input matching circuit, and a second inductor can be used as an inductor for supplying a drain bias potential, and therefore, it is possible to prevent an increase of the first transformer in size, and to downsize an amplifier circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that the various changes, substitutions, and alterations could be made hereto without departing from the spirit and scope of the invention.

What is claimed is:

1. An amplifier circuit, comprising:
   a first transformer in which a first inductor and a second inductor are magnetically coupled;
   a first field-effect transistor in which a gate is connected to a first input node via the first inductor, a drain is connected to a drain bias potential node via the second inductor, and a source is connected to a reference potential node;
   a first output node connected to the drain of the first field-effect transistor;
   a third inductor connected between the first input node and a first gate bias potential node; and
   a first capacitor connected between the first input node and an input terminal.

2. The amplifier circuit according to claim 1, further comprising:
   a second transformer in which a fourth inductor and a fifth inductor are magnetically coupled;
   a second field-effect transistor in which a gate is connected to a second input node via the fourth inductor, a drain is connected to the drain bias potential node via the fifth inductor, and a source is connected to a reference potential node;
   a second output node connected to the drain of the second field-effect transistor;
   a sixth inductor connected between the second input node and a second gate bias potential node; and
   a second capacitor connected between the first output node and the second input node.

3. The amplifier circuit according to claim 2, further comprising:
   a seventh inductor connected to the second capacitor in series.

4. The amplifier circuit according to claim 1,
   wherein radiuses of windings of the first inductor and the second inductor are different from one another.

5. The amplifier circuit according to claim 1,
   wherein center axes of windings of the first inductor and the second inductor are deviated from one another.

6. The amplifier circuit according to claim 1,
   wherein winding numbers of windings of the first inductor and the second inductor are different from one another.

* * * * *